(12) United States Patent
Besnard et al.

(10) Patent No.: US 11,491,956 B2
(45) Date of Patent: Nov. 8, 2022

(54) SYNCHRONIZATION METHOD FOR READING A STATUS OF AN ELECTRICAL CONTACT OF A MOTOR VEHICLE

(71) Applicants: Continental Automotive France, Toulouse (FR); Continental Automotive GmbH, Hannover (DE)

(72) Inventors: Pierre-Yves Besnard, Frouzins (FR); Vincent Fabre, Mons (FR)

(73) Assignees: CONTINENTAL AUTOMOTIVE FRANCE, Toulouse (FR); CONTINENTAL AUTOMOTIVE GMBH, Hannover (DE)

( * ) Notice: Subject to any disclaimer, the term of this patent is extended or adjusted under 35 U.S.C. 154(b) by 394 days.

(21) Appl. No.: 16/753,071

(22) PCT Filed: Oct. 8, 2018

(86) PCT No.: PCT/FR2018/052469
§ 371 (c)(1),
(2) Date: Apr. 2, 2020

(87) PCT Pub. No.: WO2019/073152
PCT Pub. Date: Apr. 18, 2019

(65) Prior Publication Data
US 2020/0290570 A1 Sep. 17, 2020

(30) Foreign Application Priority Data
Oct. 9, 2017 (FR) ........................................ 1759427

(51) Int. Cl.
*H03K 3/012* (2006.01)
*G06F 1/12* (2006.01)
(Continued)

(52) U.S. Cl.
CPC . *B60S 1/28* (2013.01); *B60S 1/06* (2013.01); *G06F 1/12* (2013.01); *G06F 1/26* (2013.01); *H03K 3/012* (2013.01); *H03K 5/19* (2013.01)

(58) Field of Classification Search
CPC ........ H03K 7/08; H03K 17/951; H03K 17/96; H03K 17/9631; H03K 17/963;
(Continued)

(56) References Cited

U.S. PATENT DOCUMENTS 7,058,484 B1 * 6/2006 Potega ................ H02J 7/00047
700/297
2002/0177931 A1 * 11/2002 Iwasaki ................... E05B 81/86
701/33.4

(Continued)

OTHER PUBLICATIONS

International Search Report and Written Opinion for International Application No. PCT/FR2018/052469, dated Nov. 28, 2018, 8 pages.

*Primary Examiner* — John W Poos
(74) *Attorney, Agent, or Firm* — RatnerPrestia

(57) ABSTRACT

A method for synchronizing acquisition of an analog signal value with a read signal for a state of an electrical contact of a motor vehicle. The method includes: controlling, at each start time of the first task, the power supply module so that the power supply module generates a read signal voltage pulse at the interface module input; at the same start time, triggering a counter for a predetermined duration shorter than the duration of the read signal voltage pulse; on the expiration of the counter duration, measuring the value of an analog signal generated by the interface module based on the state signal and of the read signal; and controlling, at the next start time of the second task, the power supply module so that the power supply module generates a zero voltage signal at the interface module input until the next start time of the first task.

10 Claims, 3 Drawing Sheets

(51) Int. Cl.
*G06F 1/26* (2006.01)
*H03K 5/19* (2006.01)
*B60S 1/28* (2006.01)
*B60S 1/06* (2006.01)

(58) Field of Classification Search
CPC ............ H03K 17/9627; H03K 17/955; H03K 5/1252; H03K 17/9647; H03K 2017/9606; G06F 1/3243; G06F 1/3287; G06F 1/24; G06F 1/26; G06F 1/3296; G06F 1/324; G06F 1/3228; G06F 1/3206; H03M 1/12; B60R 16/03; G01R 31/58; G01P 3/489; H05B 47/185; B60S 1/08; H04Q 9/00
See application file for complete search history.

(56) References Cited

U.S. PATENT DOCUMENTS

| | | | |
|---|---|---|---|
| 2003/0229403 A1* | 12/2003 | Nakazawa | ............ H01H 9/167 |
| | | | 700/13 |
| 2007/0091533 A1 | 4/2007 | Masuda | |
| 2009/0091533 A1* | 4/2009 | Yang | ................... G06F 1/1616 |
| | | | 345/158 |

* cited by examiner

SYNCHRONIZATION METHOD FOR READING A STATUS OF AN ELECTRICAL CONTACT OF A MOTOR VEHICLE

CROSS REFERENCE TO RELATED APPLICATIONS

This application is the U.S. National Phase application of PCT International Application No. PCT/FR2018/052469, filed Oct. 8, 2018, which claims priority to German Patent Application No. 1759427, filed Oct. 9, 2017, the contents of such applications being incorporated by reference herein.

FIELD OF THE INVENTION

The present invention relates to the automotive field and relates more particularly to a method for synchronizing the acquisition of a value of an analog signal with a read signal for a state of an electrical contact of a motor vehicle, and a computer for a motor vehicle implementing such a method. The invention is applicable in particular to the determination of the state of an electrical contact used in the operation of vehicle equipment.

BACKGROUND OF THE INVENTION

A motor vehicle comprises in known manner motorized equipment, the position of which at rest, i.e. when deactivated, is predetermined and fixed. Such elements are, for example, wipers which, when activated, perform a periodic sweeping movement which passes temporarily through the rest position and, when they are deactivated, are stationary and fixed in said rest position. Detecting this rest position advantageously makes it possible to stop the wipers in said rest position in order to prevent them from being stationary in a position which is inconvenient for the driver, for example in the middle of the windshield in their field of view.

To detect the rest position of a wiper, it is known practice to use an electrical contact connected to the drive motor of said wiper. More specifically, the motor allows the electrical contact to open and close in alternation according to the wiping position of the wiper. The closed state of the electrical contact defines the rest position of the wiper while the open state of the electrical contact defines an activation position of the wiper, other than the rest position. When the driver of the vehicle gives the command for the wiper to stop, the motor is controlled so as to stop only when the electrical contact is in the closed state, which may be the current state or the next state (if the contact was open when the wiper stop command was given).

The succession of electrical states of the contact defines a pulsed voltage signal, the duration of each pulse of which is typically about a few tenths or hundreds of a millisecond. Each pulse corresponds to a closed state of the contact for which the current flows through said contact, the value of the signal being zero between two pulses, which then corresponds to the open state of the contact.

To determine the state of the contact, it is therefore necessary to read this pulsed voltage signal. To this end, the vehicle comprises in known manner a computer including a microcontroller connected to the electrical contact so as to read the pulsed voltage signal generated at the terminals of the electrical contact.

When this read is performed continuously, it results in a substantial consumption of power by the microcontroller, which is a substantial drawback in the context of such an onboard application.

To overcome this drawback, as illustrated in FIG. 1, it is known practice to use a power supply module 1-2 internal to the computer 1, controlled by the microcontroller 1-1, as well as an interface module 1-3. This interface module 1-3 is placed between the microcontroller 1-1, the power supply module 1-2 and the electrical contact 2, the states of which it is desired to determine. The interface module 1-3 comprises in known manner a plurality of electrical components, in particular one or more resistors, making it possible to adapt the pulsed voltage signal generated at the terminals of the electrical contact 2 so that it is readable by the microcontroller 1-1.

When the computer 1 is in operation and with reference to FIGS. 1 and 2, the microcontroller 1-1 periodically controls the supply module 1-2 so that it generates a read signal SL having a succession of current pulses P of very short duration, for example about 500 μs. The interface module 1-3 then generates an analog signal SA on the basis of the read signal SL and a signal E, which is representative of the states of the electrical contact 2.

This analog signal SA is a continuous signal representing the values of the multiplication of the read signal SL and of the state signal E. The value of the analog signal SA is measured by the microcontroller 1-1 at one E1 of its inputs periodically, in order to save power, at a time referred to as the "acquisition" time $t_A$. Thus, to measure a value representative of the state signal E, it is therefore necessary to measure the analog signal SA for the duration of a pulse of the read signal SL.

However, in practice, the generation of the analog signal SA by the interface module 1-3 requires a transient period for powering up certain components of said interface module 1-3, for example capacitors and inductors. Also, it is necessary to measure the analog signal SA for the duration of a pulse of the read signal SL but after said transient period, i.e. toward the end of a pulse of the read signal SL, for example at approximately 80% of the duration of a pulse of the read signal SL, i.e. 400 μs after the start of a pulse with a duration of 500 μs.

Still with reference to FIGS. 1 and 2, when the microcontroller 1-1 measures the voltage value of the analog signal SA, it generates a sampled signal SE which is proportional to said value and which is constant between two acquisition times. This sampled signal SE thus takes the form of a succession of high states, which correspond to the closed states of the contact 2, and of low states, which correspond to the open states of the contact 2.

In a known manner, the microcontroller 1-1 simultaneously manages a plurality of tasks which it triggers on a regular basis. These tasks may for example consist in reading the inputs or activating the outputs of the microcontroller 1-1, transmitting messages over the vehicle's communication networks or any software activity requiring periodic or non-periodic processing.

The management of these tasks may however slow down or, conversely, accelerate the frequency of acquisition of the voltage value of the analog signal SA, i.e. acquisition may be delayed or, conversely, ahead of time. In this case, since the generation of the read signal SL and the acquisition of the voltage value of the analog signal SA at the acquisition time are not synchronized, it may result in the voltage value of the analog signal SA being acquired between two current pulses P of the read signal SL or at the start of current pulse P, while the electronic components of the interface module 1-3 are powering up. In both cases, the voltage value read by the microcontroller 1-1 may be erroneous and cause the wiper to stop outside its rest position, which is a major drawback, in particular for the safety of vehicle's occupants.

SUMMARY OF THE INVENTION

There is therefore a need for a straightforward, effective and inexpensive solution for detecting the state of an electrical contact in a motor vehicle.

To this end, the subject of an aspect of the invention is a method for synchronizing the acquisition of a value of an analog signal with a read signal for a state of an electrical contact of a motor vehicle by means of a computer on board said motor vehicle, said computer comprising a microcontroller, a power supply module and an interface module, said interface module being electrically connected to said microcontroller and to said power supply module, said electrical contact being electrically connected to the interface module so as to provide it with a state signal of the state of said electrical contact, the microcontroller periodically managing at least a first task and a second task in alternation. The method, implemented by the microcontroller, is noteworthy in that it includes the steps of:

controlling, at each start time of the first task, the power supply module so that said power supply module generates a voltage pulse of a read signal at the input of the interface module;

at the same start time of the first task, triggering a counter for a predetermined duration that is shorter than the duration of said voltage pulse of the read signal;

on the expiration of the duration of said counter, measuring the value of an analog signal generated by the interface module on the basis of the state signal and of the read signal; and controlling, at the next start time of the second task, the power supply module so that said power supply module generates a zero voltage signal at the input of the interface module until the next start time of the first task.

The method according to an aspect of the invention advantageously makes it possible to synchronize the acquisition of the value of the analog signal with the start of the first task such that, even if the first task and the second task are out of sync, the analog signal is read at the right time, i.e. at the end of the duration of the counter that began at the start of the first task.

According to one aspect of the invention, the counter has a duration between 50% and 100% of the duration of the pulse.

Preferably, the counter has a duration between 70% and 90% of the duration of the pulse.

More preferably, the counter has a duration of about 80% of the duration of the pulse. For example, if the pulse has a duration of 500 µs, then the duration of the counter may for example be about 400 µs.

An aspect of the invention also relates to a computer, for installation on board a motor vehicle, for synchronizing the acquisition of a value of an analog signal with a read signal for a state of an electrical contact of said motor vehicle, said computer comprising a microcontroller, a power supply module and an interface module, said interface module being electrically connected to said microcontroller and to said power supply module, said electrical contact being electrically connected to the interface module so as to provide it with a state signal of the state of said electrical contact, the microcontroller periodically managing at least a first task and a second task in alternation. The microcontroller is noteworthy in that it is configured for:

controlling, at each start time of the first task, the power supply module so that said power supply module generates a voltage pulse of a read signal at the input of the interface module;

at the same start time of the first task, triggering a counter for a predetermined duration that is shorter than the duration of said voltage pulse of the read signal;

on the expiration of the duration of said counter, measuring the value of an analog signal generated by the interface module on the basis of the state signal and of the read signal; and controlling, at the next start time of the second task, the power supply module so that said power supply module generates a zero voltage signal at the input of the interface module until the next start time of the first task.

According to one aspect of the invention, the counter has a duration between 50% and 100% of the duration of the pulse.

Preferably, the counter has a duration between 70% and 90% of the duration of the pulse.

More preferably, the counter has a duration of about 80% of the duration of the pulse.

According to one feature of the invention, the read signal generated by the power supply module is suitable for cleaning the electrical contact.

Preferably, the intensity of the electric current generated by the power supply module is higher than 0.05 A.

An aspect of the invention lastly relates to a motor vehicle comprising a computer, such as presented above, and an electrical contact that is electrically connected to the interface module of said computer.

BRIEF DESCRIPTION OF THE DRAWINGS

Other features and advantages of the invention will become apparent from the following description, given with reference to the appended figures that are given by way of non-limiting example and in which identical references are given to similar objects.

DETAILED DESCRIPTION OF THE PREFERRED EMBODIMENTS

The computer according to an aspect of the invention is intended to be installed on board a motor vehicle in order to determine the states of one or more electrical contacts of equipment of the vehicle.

In what follows, the detection of the state of an electrical contact of a wiper of a motor vehicle is presented. It should be noted that such an application does not limit the scope of an aspect of the present invention, which is applicable to any electrical contact of a vehicle as well as to any type of vehicle.

Such a wiper is connected in a known manner to an electric motor which drives it in a sweeping motion, for example across the windshield of the vehicle, in order to remove deposited liquid, for example rainwater, and thus allow the driver to have good visibility.

When the wiper is deactivated, the electric motor stops so that the wiper is in a predetermined rest position in which it does not interfere with the driver's view. This predetermined rest position may for example correspond to a position in which the wiper lies substantially horizontally at the bottom of the vehicle windshield, out of the driver's field of view.

Figure 3:
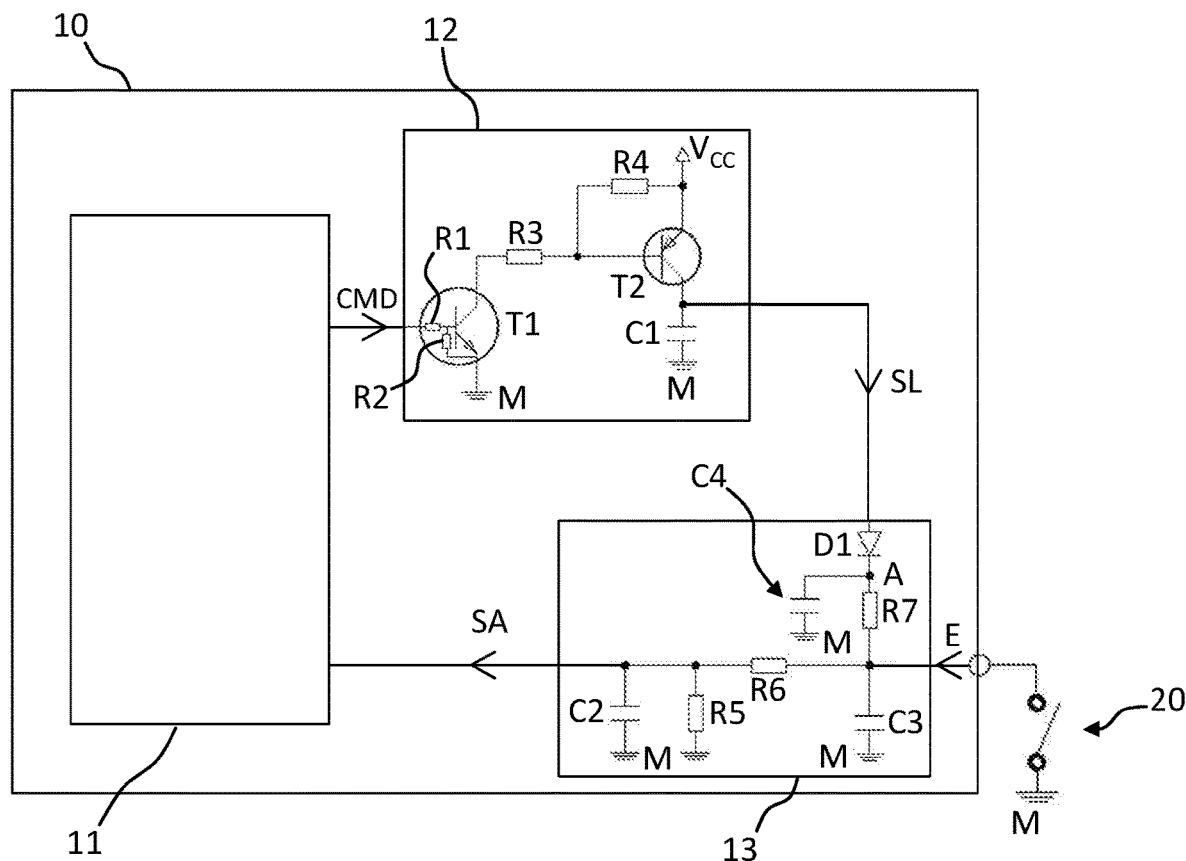
FIG. 3 schematically shows one embodiment of a computer according to an aspect of the invention.

FIG. 3 shows an example of an electronic computer 10 that is electrically connected to an electrical contact 20 of a wiper (not shown) so as to determine the state thereof. This computer 10 may for example be a control computer for controlling electrical equipment of the vehicle, known as a BCM, for "body control module". Such a BCM is suitable for controlling and monitoring electrical equipment of the vehicle such as, for example, the head- and signaling lights, the opening of doors, the wipers, etc.

Figure 1:
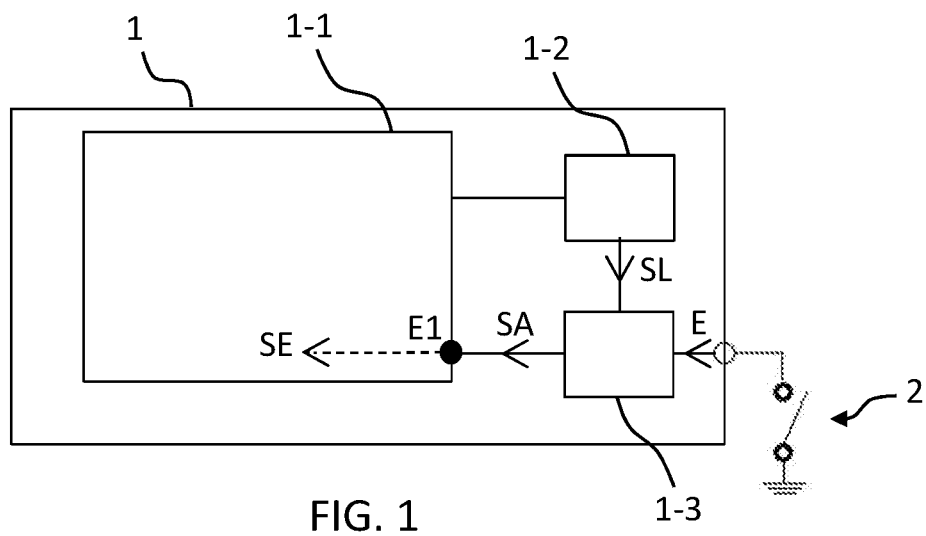
FIG. 1 (mentioned above) schematically shows a computer of the prior art allowing the state of an electrical contact to be detected.
Figure 2:
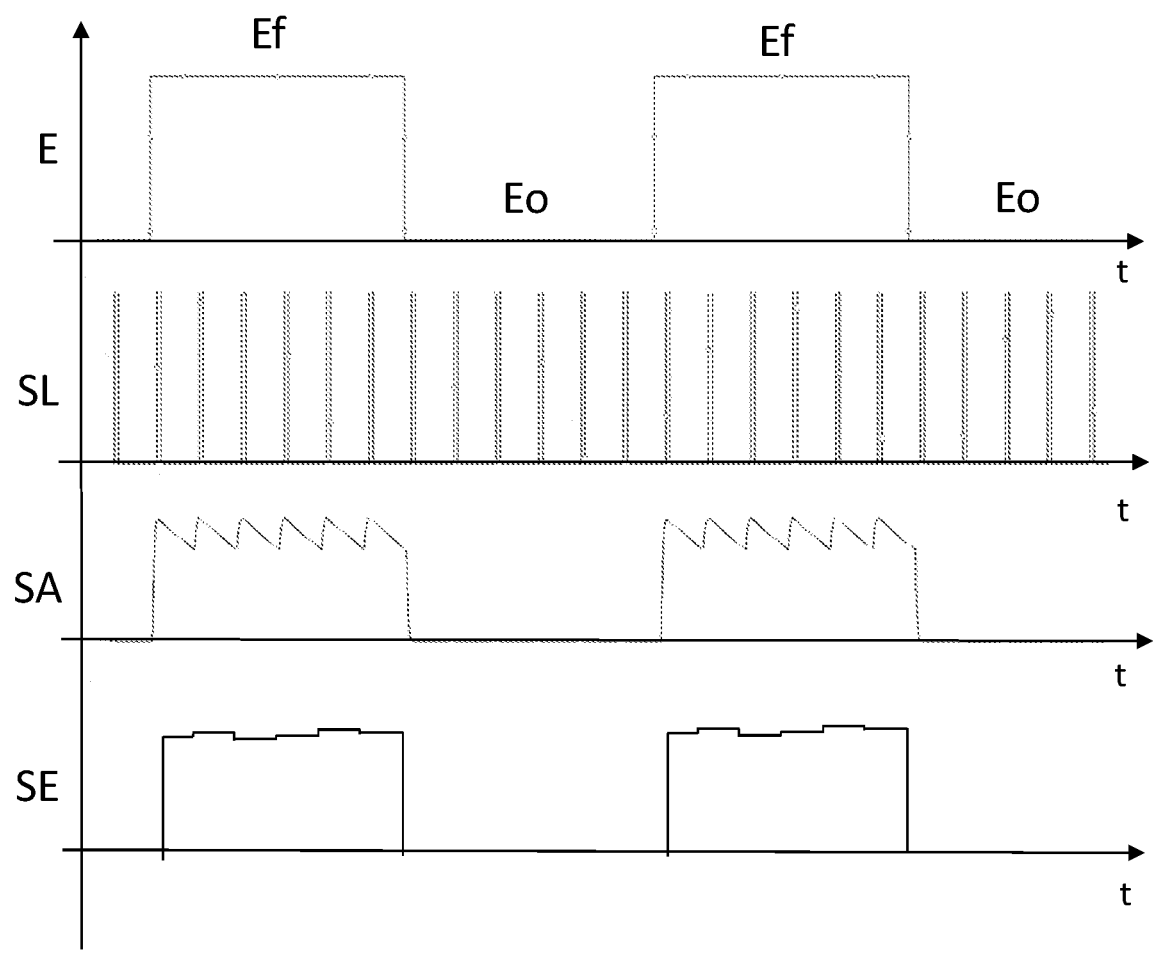
FIG. 2 (mentioned above) shows a state signal, a read signal, an analog signal and a sampled signal.

In this example and in a known manner, the electrical contact 20 is connected to the wiper such that, with reference to FIG. 2, in the rest position of the wiper, the electrical contact 20 is in the closed state Ef (high state) and, outside the rest position of the wiper, the electrical contact 20 is in the open state Eo (low state), these successive open Eo and closed Ef states defining, at the terminals of the electrical contact 20, a signal referred to as the "state signal" E. It goes without saying that the electrical contact 20 could be connected to the wiper differently, in particular so as to be in the open state Eo in the rest position of the wiper and in the closed state Ef out of the rest position of the wiper.

Referring back to FIG. 3, the computer 10 comprises a microcontroller 11, a power supply module 12 and an interface module 13.

The power supply module 12 is electrically connected both to the microcontroller 11 and to the interface module 13. Advantageously, the microcontroller 11 and the power supply module 12 may be connected by a connection link referred to as an SPI, for "Serial Peripheral Interface".

The interface module 13 is electrically connected to all three of the power supply module 12, of the electrical contact 20 and of the microcontroller 11.

With reference to FIGS. 2 and 3, the microcontroller 11 is configured to control the power supply module 12, via the transmission of a CMD command, so that the latter generates a periodic pulsed voltage electrical signal, referred to as the "read signal" SL, at the input of the interface module 13.

As illustrated in FIG. 2, this read signal SL is a periodic signal, the period of which is about 5 ms, having a succession of current pulses P1, representing the high states of the read signal SL, of very short duration, for example about 500 µs. The power supply module 12 is suitable for generating current pulses P1, preferably of high intensity, for example about 0.05 A to 0.1 A, in order to make it possible to clean off, through the generation of electric arcs, grease residue and traces of oxidation which may build up on the electrical contact 20.

Advantageously, the power supply module 12 may be included within a component of the computer 10, such as a smart high-side driver or a circuit, also referred to as an SBC for "system basis chip", incorporating a plurality of functions including high-side outputs. Thus, no additional element is required, which limits the cost of the computer 10. An input of the SBC is then connected to the microcontroller 11 in order to receive the command for generating the read signal SL and an output of the SBC is connected to the interface module 13 in order to send the read signal SL to the interface module 13.

In the non-limiting example of FIG. 3, the power supply module 12 comprises a resistor R1 connected both to the microcontroller 11 and to the base of an NPN transistor T1. The power supply module 12 also includes a resistor R2 connected both to the base of the transistor T1 and to ground M, which is itself connected to the emitter of the transistor T1. A resistor R3 is connected to the collector of the transistor T1, and to a resistor R4 and to the base of a PNP transistor T2. The resistor R4 is connected to a supply voltage $V_{CC}$, for example of 5 V. The emitter of the transistor T2 is connected to the supply voltage $V_{CC}$ and the collector of the transistor T2 is connected both to the interface module 13 and to a capacitor C1, which is itself connected in turn to ground M. Since this assembly and its operation are known, they will not be described in further detail here. It should also be noted that any other suitable type of assembly could be used.

The interface module 13 allows the status signal E received from the electrical contact 20 to be adapted so that the microcontroller 11 can read it. More specifically, the interface module 13 is configured to generate an analog signal SA, transmitted to the microcontroller 11, on the basis of the current pulses P1 of the read signal SL and of the state signal E, this analog signal SA being representative of the open and closed states Eo, Ef of the electrical contact 20.

To this end, the interface module 13 comprises a capacitor C2 that is connected both to the microcontroller 11 and to ground M, a resistor R5 that is connected both to the microcontroller 11 and to ground M and a resistor R6 that is connected both to the microcontroller 11 and to the electrical contact 20. The interface module 13 also comprises a diode D1 that is connected both to the power supply module 12 and to a resistor R7, which is itself connected in turn to the electrical contact 20, a point A being defined between the diode D1 and the resistor R7. The interface module 13 further comprises a capacitor C3, which is connected both to the electrical contact 20 and to ground M, and a capacitor C4, which is connected both to the point A and to ground M. Since this assembly and its operation are known per se, they will not be described in further detail here. It should also be noted that any other suitable type of assembly could be used.

Furthermore, the microcontroller 11 is configured to manage a plurality of tasks simultaneously, which it triggers on a regular basis. These tasks may for example consist in reading the inputs or activating the outputs of the microcontroller 11, transmitting messages over the vehicle's communication networks or any software activity requiring periodic or non-periodic processing.

Figure 4:
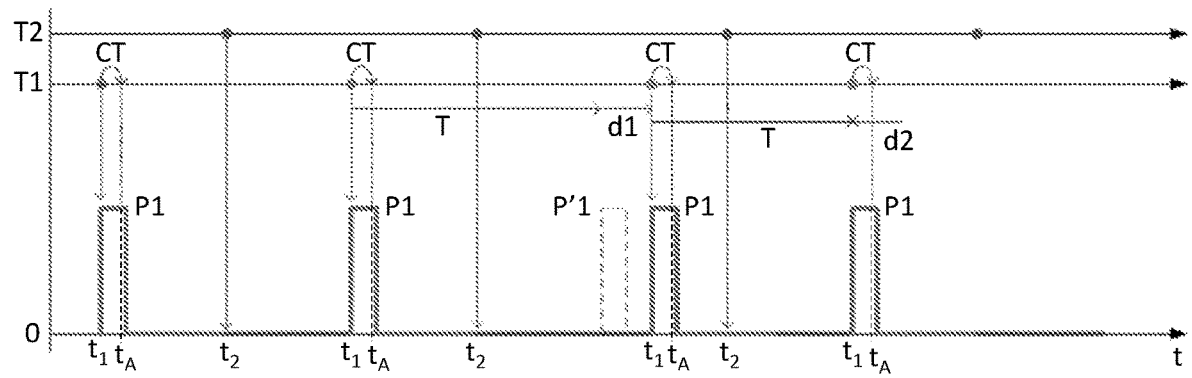
FIG. 4 shows the synchronization of two tasks and of the acquisition of an analog signal by the computer of FIG. 3.

In one embodiment, with reference to FIG. 4, the microcontroller 11 is configured to manage a first task T1 and a second task T2 periodically in alternation. The first task T1 begins at a task start time denoted by $t_1$ while the second task T2 starts at a task start time denoted by $t_2$. However, it should be noted that an aspect of the invention could be applied to the periodic management of more than two tasks.

To prevent a delay in the processing of one or more of the tasks from causing a shift in the acquisition time $t_A$, the microcontroller 11 is configured for:

controlling, at each start time $t_1$ of the first task T1, the power supply module 12 so that said power supply module 12 generates a pulse P1 of a read signal SL at the input of the interface module;

at the same start time $t_1$ of the first task T1, triggering a counter CT for a predetermined duration that is shorter than the duration of said voltage pulse P1 of the read signal SL;

on the expiration of said counter, reading the analog signal SA generated by the interface module 13 on the basis of the state signal E of the state of the electrical contact 20 and of the generated read signal SL; and controlling, at the next start time $t_2$ of the second task T2, the power supply module 12 so that said power supply module 12 generates or maintains a zero voltage signal at the input of the interface module 13 until the next start time $t_1$ of the first task T1.

Lastly, the microcontroller 11 is configured to determine the state of the electrical contact 20 on the basis of the value of the analog signal SA that it receives. More specifically, the reading of the analog signal SA at the acquisition times $t_A$ allows the microcontroller 11 to generate a sampled signal SE as voltage pulses, illustrated for example in FIG. 2, the pulses of this signal SE taking as their value the value of the analog signal SA measured at the acquisition times $t_A$.

It should be noted that the electrical influence of the interface module 13 on the analog signal SA outside the pulses P1, and more particularly outside the acquisition times $t_a$, has no effect on the implementation of an aspect of the invention.

Figure 5:
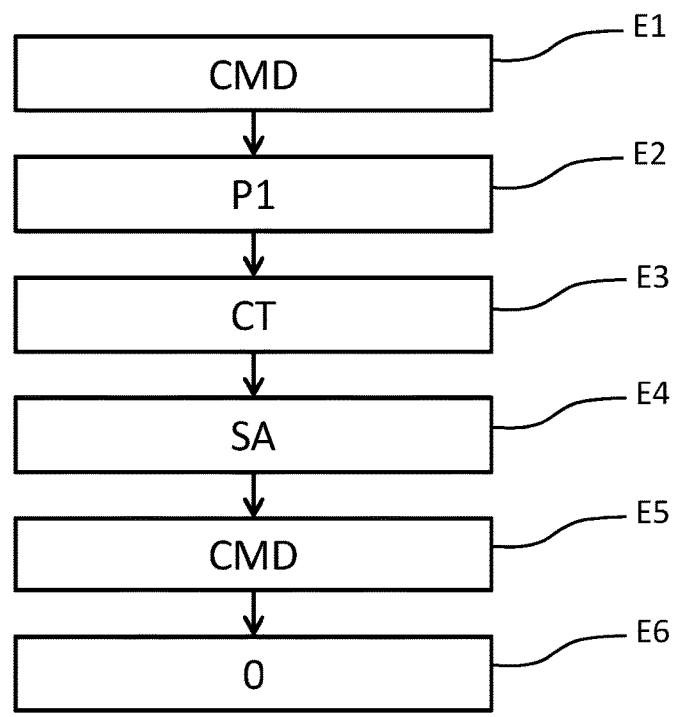
FIG. 5 shows one implementation of the method according to an aspect of the invention.

One implementation of the method according to an aspect of the invention will now be described with reference to FIGS. 4 and 5.

First, in a step E1, the microcontroller 11 controls (CMD), at each start time $t_1$ of the first task T1, the power supply module 12 so that said power supply module 12 generates, in a step E2, a pulse P1 of a read signal SL at the input of the interface module 13.

At the same start time $t_1$ of the first task T1, the microcontroller 11 triggers, in a step E3, a counter for a predetermined duration CT that is shorter than the duration of said voltage pulse P1 of the read signal SL. Preferably, the duration of the counter CT is about 80% of the duration of the pulse P1 of the read signal SL. For example, if the pulse P1 has a duration of 500 µs, then the duration of the counter CT may for example be about 400 µs.

On the expiration of said counter, the microcontroller 11 measures, in a step E4, the value of the analog signal SA generated by the interface module 13 on the basis of the state signal E and of the read signal SL.

Next, the microcontroller 11 controls (CMD), in a step E5, at the next start time $t_2$ of the second task T2, the power supply module 12 so that said power supply module 12 generates, in a step E6, a zero voltage signal at the input of the interface module 13 until the next start time $t_1$ of the first task T1.

An aspect of the invention thus allows the microcontroller 11 to synchronize the acquisition times $t_A$ of the analog signal SA with the start of the tasks T1 and T2 such that, by adapting the duration of the counter, each acquisition time $t_A$ occurs toward the end of each pulse P1 of the read signal SL, thus making it possible to obtain relevant measurements of the analog signal SA.

For example, with reference to FIG. 4, when the task T1, which is supposed to be periodic (with period T), experiences a delay d1 in addition to its period T (i.e. the execution of the task is slowed down) or an advance d2 ahead of its period T, the method according to an aspect of the invention makes it possible to prevent the acquisition time $t_A$ of the voltage value of the analog signal SA from taking place during a theoretical pulse P'1 corresponding to a fixed period of the read signal SL or else at the start of a pulse P1, when the electronic components of the interface module 13 are powering up.

The method according to an aspect of the invention thus makes it possible to ensure that the voltage value of the analog signal SA used by the microcontroller 11 to generate the sampled signal SE is correct, thus avoiding the wiper stopping outside its rest position.

The invention claimed is:

1. A method for synchronizing acquisition of a value of an analog signal with a read signal for a state of an electrical contact of a motor vehicle by a computer on board said motor vehicle, said computer comprising a microcontroller, a power supply module and an interface module, said interface module being electrically connected to said microcontroller and to said power supply module, said electrical contact being electrically connected to the interface module so as to provide it with a state signal of the state of said electrical contact, the microcontroller periodically managing at least a first task and a second task in alternation, the method, implemented by the microcontroller, the method comprising:

controlling, at each start time of the first task, the power supply module so that said power supply module generates a voltage pulse of a read signal at an input of the interface module;

at the same start time of the first task, triggering a counter for a predetermined duration that is shorter than a duration of said voltage pulse of the read signal;

on the expiration of the duration of said counter, measuring the value of an analog signal generated by the interface module on the basis of the state signal and of the read signal; and controlling, at the next start time of the second task, the power supply module so that said power supply module generates a zero voltage signal at the input of the interface module until the next start time of the first task.

2. The method as claimed in claim 1, wherein the counter has a duration between 50% and 100% of the duration of the pulse.

3. The method as claimed in claim 2, wherein the counter has a duration between 70% and 90% of the duration of the pulse.

4. The method as claimed in claim 3, wherein the counter has a duration of about 80% of the duration of the pulse.

5. A computer, for installation on board a motor vehicle, for synchronizing acquisition of a value of an analog signal with a read signal for a state of an electrical contact of said motor vehicle, said computer comprising a microcontroller, a power supply module and an interface module, said interface module being electrically connected to said microcontroller and to said power supply module, said electrical contact being electrically connected to the interface module so as to provide it with a state signal of the state of said electrical contacts, the microcontroller periodically managing at least a first task and a second task in alternation, the microcontroller being configured for:

controlling, at each start time of the first task, the power supply module so that said power supply module generates a voltage pulse of a read signal at an input of the interface module;

at the same start time of the first task, triggering a counter for a predetermined duration that is shorter than a duration of said voltage pulse of the read signal;

on the expiration of the duration of said counter, measuring the value of an analog signal generated by the interface module on the basis of the state signal and of the read signal; and controlling, at the next start time of the second task, the power supply module so that said power supply module generates a zero voltage signal at the input of the interface module until the next start time of the first task.

6. The computer as claimed in claim 5, wherein the counter has a duration between 50% and 100% of the duration of the pulse.

7. The computer as claimed in claim 6, wherein the counter has a duration between 70% and 90% of the duration of the pulse.

8. The computer as claimed in claim 7, wherein the counter has a duration of about 80% of the duration of the pulse.

9. The computer as claimed in claim 5, wherein an intensity of the electric current generated by the power supply module is higher than 0.05 A.

10. A motor vehicle comprising a computer as claimed in claim 5, and an electrical contact that is electrically connected to the interface module of said computer.

* * * * *